(12) United States Patent
Chou et al.

(10) Patent No.: US 7,095,162 B2
(45) Date of Patent: Aug. 22, 2006

(54) PIEZOELECTRIC BLADE ANCHORING STRUCTURE

(75) Inventors: Chin-Wen Chou, Taipei Hsien (TW); Ying-Nan Cheng, Taipei Hsien (TW)

(73) Assignee: Zippy Technology Corp., Taipei Hsien ( * ) Notice: Subject to any disclaimer, the term of this patent is extended or adjusted under 35 U.S.C. 154(b) by 0 days.

(21) Appl. No.: 10/892,179

(22) Filed: Jul. 16, 2004

(65) Prior Publication Data
US 2006/0012268 A1    Jan. 19, 2006

(51) Int. Cl.
*H01L 41/047* (2006.01)
(52) U.S. Cl. .................. 310/365; 310/364; 310/366
(58) Field of Classification Search ......... 310/364–366
See application file for complete search history.

(56) References Cited

U.S. PATENT DOCUMENTS 4,441,370 A * 4/1984 Sakurada .................... 310/330
5,818,151 A * 10/1998 Takai et al. ................. 310/364
6,709,285 B1   3/2004 Chou et al. ................. 439/500

* cited by examiner

*Primary Examiner*—Darren Schuberg
*Assistant Examiner*—J. Aguirrechea
(74) *Attorney, Agent, or Firm*—Birch, Stewart, Kolasch & Birch, LLP

(57) ABSTRACT

A piezoelectric blade anchoring structure includes piezoelectric blades mounting onto a circuit board. The piezoelectric blade has electric contacts to connect electrically with conductive members located on the circuit board. A protection plate is provided to keep the conductive member in contact with the electric contact in normal conditions to avoid gaps from occurring between the piezoelectric blades and the conductive members and resulting in breaking off, and prevent oxidation and damage so that the piezoelectric blades and the circuit board can maintain a desired electric connection.

12 Claims, 6 Drawing Sheets

PIEZOELECTRIC BLADE ANCHORING STRUCTURE

FIELD OF THE INVENTION

The present invention relates to a piezoelectric blade anchoring structure and particularly to a structure that anchors piezoelectric blades and conductive members which electrically connect to a circuit board by adhering.

BACKGROUND OF THE INVENTION

The conventional technique for establishing electric connection between the electric contacts of input/output ends of piezoelectric blades and a circuit board generally is accomplished by soldering connection legs. Due to the piezoelectric blades generate vibrations during the conductive condition, the soldered connection legs that anchor the piezoelectric blades on the circuit board restrict the vibration range. Excessive vibration of the piezoelectric blades could tear off the connection legs at the soldering spots. Hence the conventional soldering connection for the connection legs and the piezoelectric blades inhibits the vibration range and reduces the performance. Moreover, connecting the circuit board and the piezoelectric blades by soldering the connection legs makes fabrication process much more troublesome.

In order to remedy the foregoing problems, The U.S. Pat. No. 6,709,285 entitled "Improved piezoelectric blade connection element" provides an electric input leg with an elastic section to connect the electric contact of the input end of the piezoelectric blade. The elastic section has one end extended to form an anchor section to connect to a circuit board and another end extended towards the upper side of the piezoelectric blade to form a retaining section to prohibit the piezoelectric blade from breaking off and also provide a desired electric connection for the piezoelectric blade.

In the cited reference, the elastic section provides a required vibration room for the piezoelectric blade and resolves the problem of limited vibration room and fracturing connection leg occurred to the conventional soldering technique. However, during vibration of the piezoelectric blade, the elastic section and the piezoelectric blade input end tend to create a gap therebetween that would generate a poor electric connection between the conductive element and the piezoelectric blade. If the vibration amplitude is very big, breaking off could happen. Moreover, anchoring of the retaining section of the conductive element needs an extra machining process such as bending or soldering. This increases the fabrication process and cost.

Furthermore, the conventional technique and the cited reference mentioned above have the electric contacts and connection legs exposed. Due to the electric contacts are made of silver, and the connection legs are made of a copper blade, they tend to attract moisture in the air and generate oxidation. This further affects the electric connection.

SUMMARY OF THE INVENTION

The primary object of the present invention is to solve the disadvantages mentioned above. The invention provides an anchoring structure to maintain a desired electric connection between electric contacts of piezoelectric blades and conductive members in normal conditions and prevent the piezoelectric blades and the conductive members from creating gaps due to vibration and breaking off, and also prevent the conductive members from being damaged by external forces and occurring oxidation to maintain a desired contact condition.

To achieve the foregoing object, the conductive member of the invention is in contact with an electric contact of the piezoelectric blades through a protection plate to maintain a desired electric connection with a circuit board. The protection plate covers the conductive member and the electric contact by adhering to the contact location. This not only enables the electric contact and the conductive member to maintain a desired electric connection during vibration of the piezoelectric blades, also prevent the electric contact and the conductive member from exposing and oxidizing which affects electric connection, and avoids damage from occurring.

The foregoing, as well as additional objects, features and advantages of the invention will be more readily apparent from the following detailed description, which proceeds with reference to the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
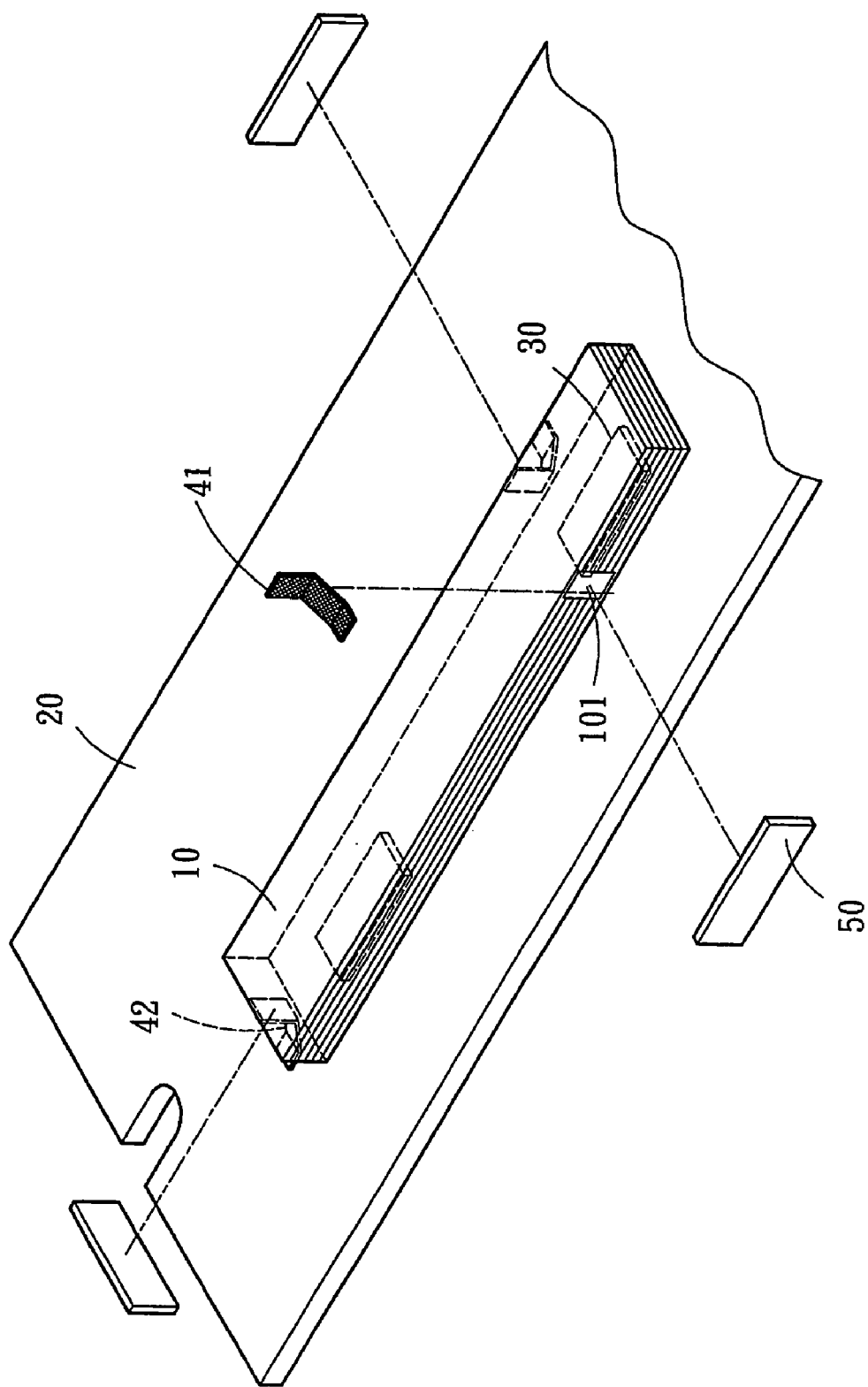
FIG. 1 is a schematic view of a first embodiment of the present invention.
Figure 2:
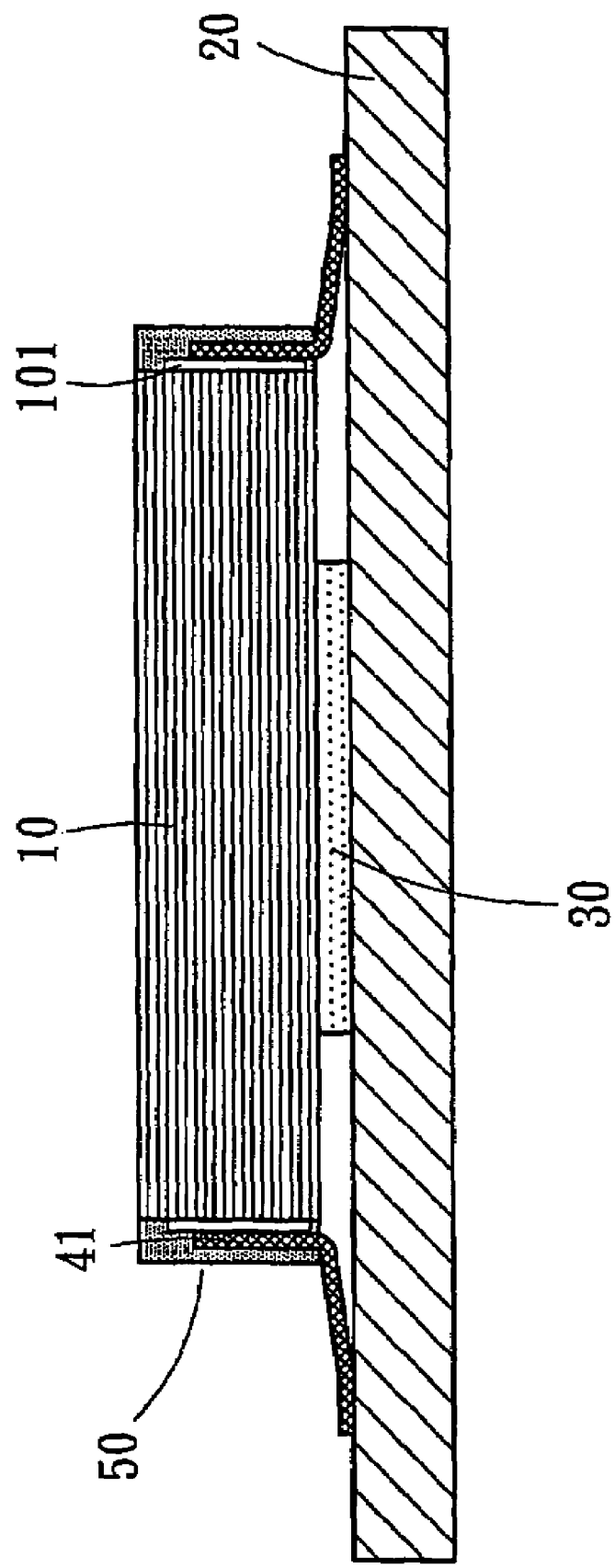
FIG. 2 is a sectional view of the first embodiment of the invention.

Please refer to FIGS. 1 and 2 for a first embodiment of the present invention. Piezoelectric blades 10 according to the invention are mounted onto a circuit board 20 interposed by an elastic member 30 to provide a desired vibration space. The piezoelectric blades 10 have electric contacts 101 to form electric connection with the circuit board 20 through conductive members 41 and 42. The conductive member 41 is taken as an example in the following discussion. It is a metal mesh formed like a plate and soldered to the circuit board 20 to form an electric connection. A protection plate 50 is provided to cover the electric contact 101 and the conductive member 41 by bonding to the contact location so that the conductive member 41 is in contact with the electric contact 101 in normal conditions.

As the bonding area of the protection plate 50 fully covers the conductive member 41 and the electric contact 101 and bonds to the contact location, it is moved with the piezoelectric blades 10 during vibration. There is no gap between them to affect the electric connection, and breaking off may be avoided. The protection plate 50 is made from pliable rubber and adhered to the piezoelectric blades 10 without affecting the vibration of the piezoelectric blades 10. It also isolates the conductive member 41 and the electric contact 101 from the external air, thus can prevent oxidation from occurring. The protection plate 50 also provides a barrier to prevent external forces from directly hitting the conductive member 41, thus damage of the conductive member 41 may be avoided, and electric shock to users also may be prevented. In addition, the protection plate 50 covers the electric contact 101 by adhering, it is easier to fabricate than the conventional soldering that requires an extra fabrication process. Production is simpler, cost is lower and replacement also is easier.

Figure 3:
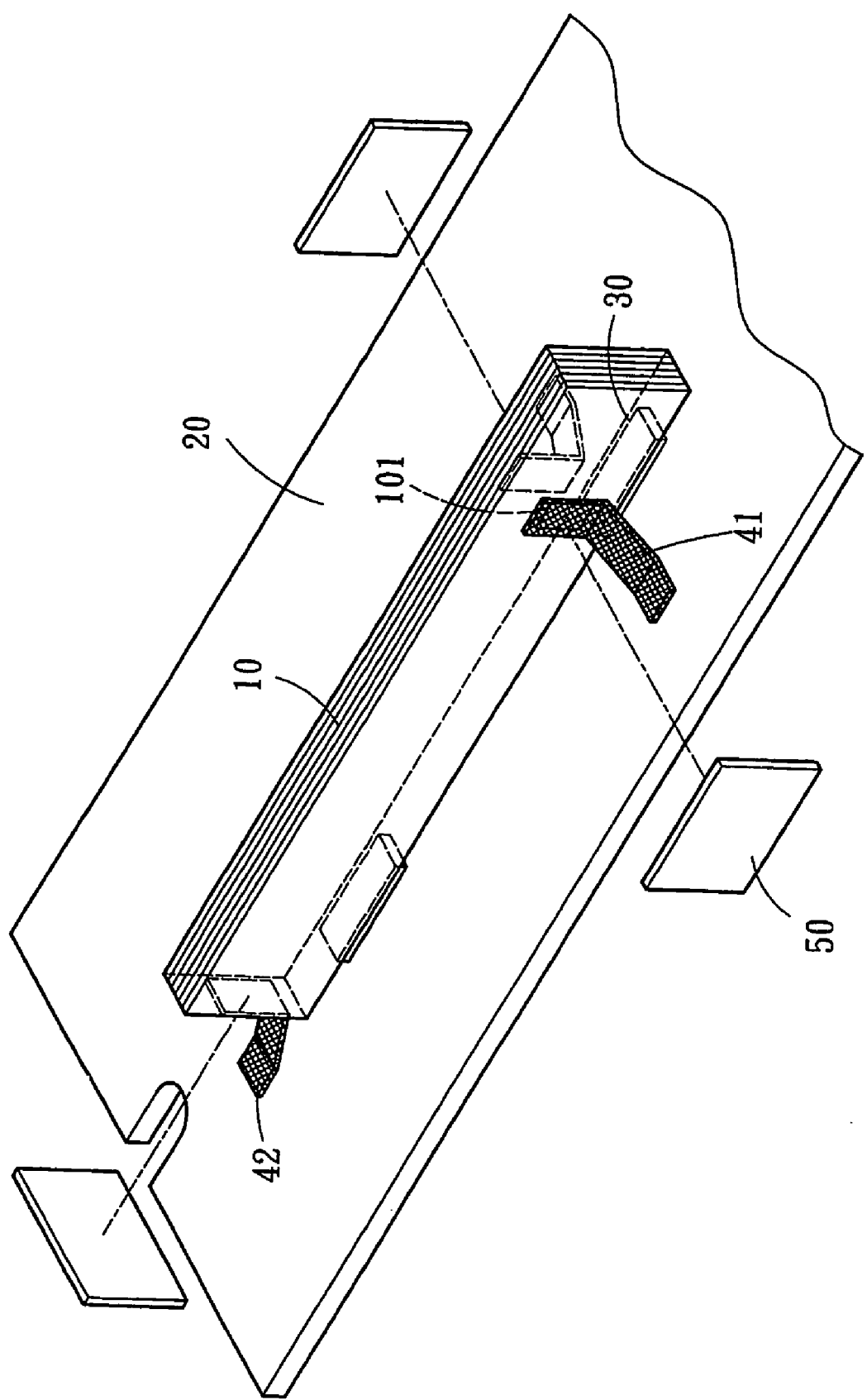
FIG. 3 is a schematic view of a second embodiment of the invention.

Refer to FIG. 3 for a second embodiment of the invention. It differs from the first embodiment by having the piezoelectric blades 10 resting vertically on the circuit board 20 for electric connection. The locations of the electric contact 101 on the piezoelectric blades 20 alter. However, the invention can also be applied to the coupling between the conductive member 41 and the electric contact 101 of the piezoelectric blades 20 that are bonded by the protection plate 50 to provide a desired electric connection.

Figure 4:
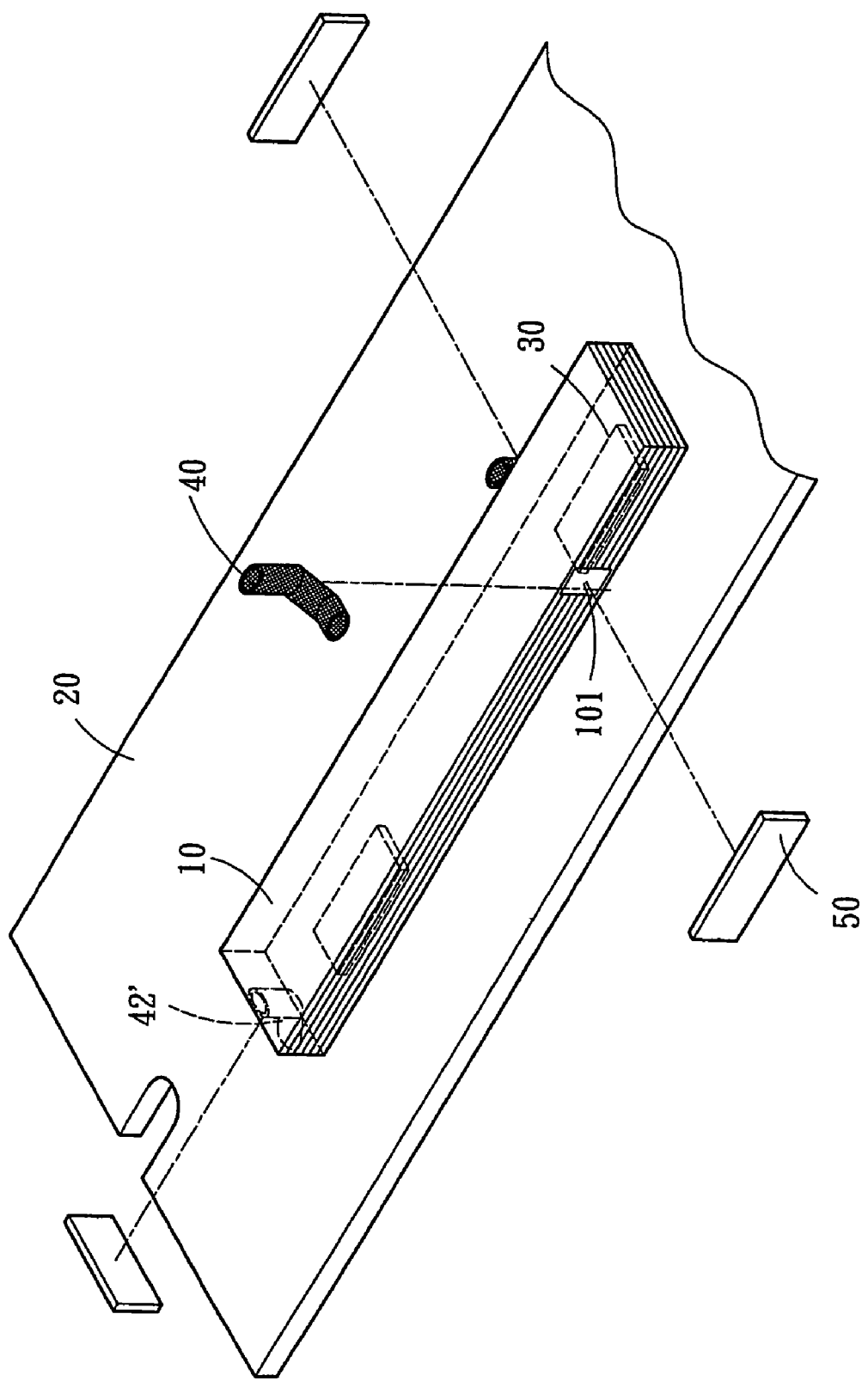
FIG. 4 is a schematic view of a third embodiment of the invention.
Figure 5:
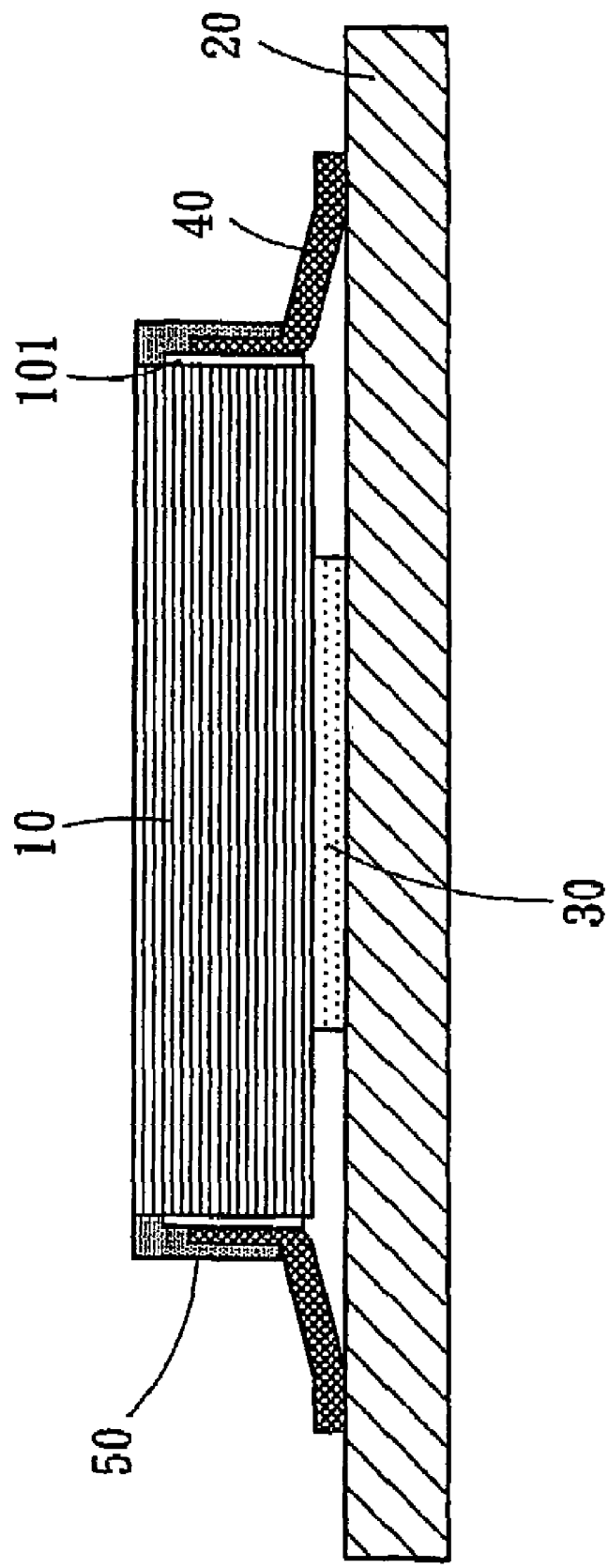
FIG. 5 is a sectional view of a third embodiment of the invention.

Refer to FIGS. 4 and 5 for a third embodiment of the invention. It differs from the first embodiment by having a conductive member 41, 42 formed in a cylindrical conductive member 40, 42' (Since the structures of the conductive member 40 and conductive member 42' are different, the following description will use the cylindrical conductive member 40 as an example). The cylindrical conductive member 40 is also covered by the protection plate 50. The cylindrical conductive member 40 is squeezed and deformed by the protection plate 50 during bonding to form a returning stress. Hence when the piezoelectric blades 10 vibrate and form a gap with the conductive member 40, the stress allows the conductive member 40 to return to its cylindrical shape to fill the gap so that the electric contact 101 and the conductive member 40 can maintain contact in normal conditions and avoid separating that might affect the electric connection.

Figure 6A:
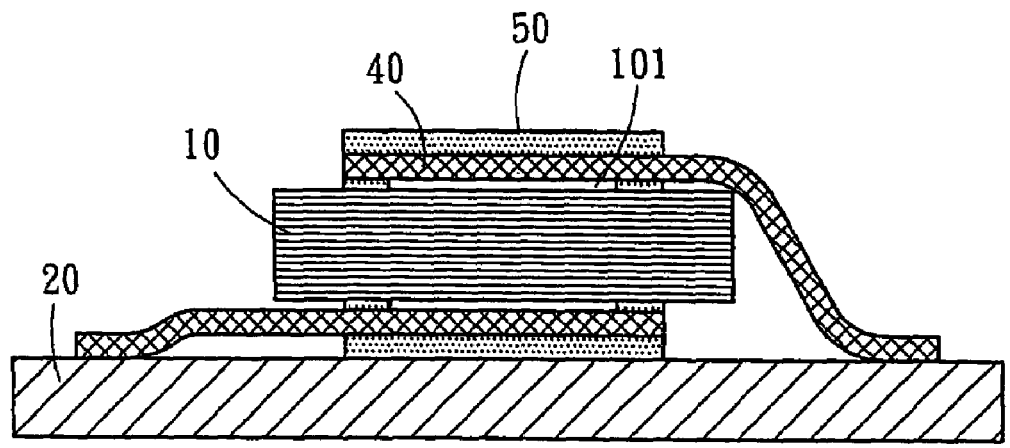
FIGS. 6A and 6B are sectional views of a fourth embodiment of the invention.
Figure 6B:
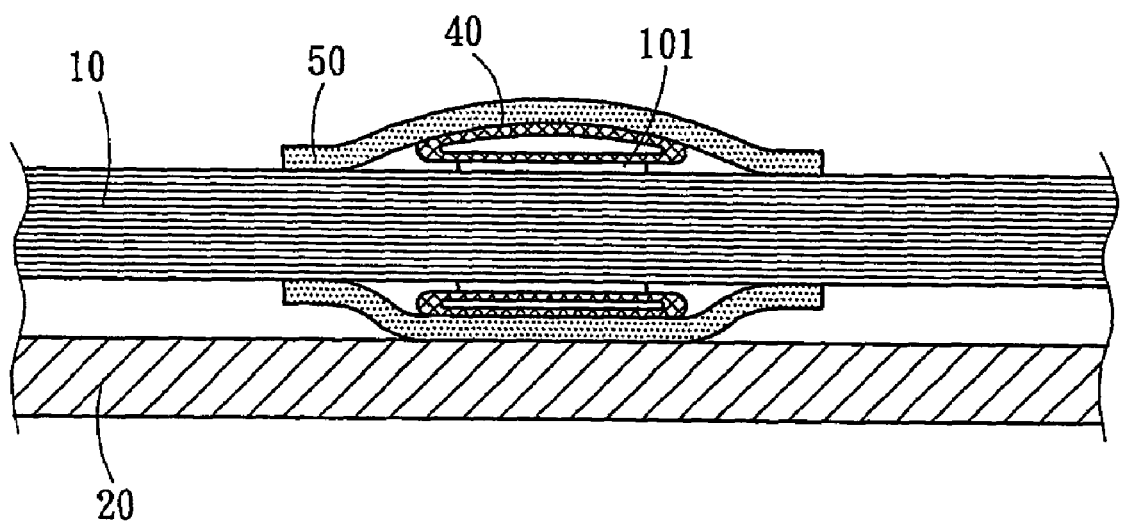

Refer to FIGS. 6A and 6B for a fourth embodiment of the invention. It differs from the previous embodiments by having the electric contacts 101 located on an upper side and a lower side of the piezoelectric blades 10. They also can be connected to the conductive members 40 through bonding of the protection plate 50. The conductive member 40 is extended towards two sides of the piezoelectric blades 10 to form electric connection with the circuit board 20. The elastic protection plate 50 is sandwiched between the piezoelectric blades 10 and the circuit board 20 to provide a vibration space for the piezoelectric blades 10. Thus there is no need to add an elastic element 30. Fabrication process is simpler.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A piezoelectric blade anchoring structure comprising: piezoelectric blades mounted onto a circuit board with an electric contact formed thereon to connect electrically with at least one conductive member located on the circuit board, and a protection plate to bond the electric contact to keep the conductive member in contact with the electric contact in normal conditions, the protection plate failing to enclose the piezoelectric blades to avoid interference with vibration of the piezoelectric blades, wherein the piezoelectric blades have a top surface, a bottom surface and side surfaces, and wherein each protection plate is only on one of the top surface, the bottom surface and the side surfaces such that an individual protection plate fails to be on more than one surface of the piezoelectric blades.

2. The piezoelectric blade anchoring structure of claim 1, wherein the protection plate is made from pliable rubber.

3. The piezoelectric blade anchoring structure of claim 1, wherein the conductive member is a metal mesh.

4. The piezoelectric blade anchoring structure of claim 3, wherein the conductive member is a plate.

5. The piezoelectric blade anchoring structure of claim 3, wherein the conductive member is cylindrical.

6. The piezoelectric blade anchoring structure of claim 1, wherein the bonding area of the protection plate fully covers the electric contact.

7. The piezoelectric blade anchoring structure of claim 1, wherein the conductive member is soldered to the circuit board to form electric connection.

8. The piezoelectric blade anchoring structure of claim 1, wherein the piezoelectric blades have a top and bottom surface in addition to side surfaces, the electric contact being connected to at least one of the side surfaces and the protection plate being only on the side surfaces such that the top and bottom surface of the piezoelectric blades are free of the protection plate.

9. The piezoelectric blade anchoring structure of claim 1, wherein the piezoelectric blades have a top and bottom surface in addition to side surfaces, a plurality of electric contacts being provided with a first electric contact being connected to one side surface of the piezoelectric blades and a second electric contact being connected to the bottom surface of the piezoelectric blades and a third electric contact being connected to the top surface of the piezoelectric blades, a protection plate being only provided for each of the electric contacts such that all but one side of the piezoelectric blades are free of the protection plate.

10. The piezoelectric blade anchoring structure of claim 1, wherein the piezoelectric blades have a top and bottom surface in addition to side surfaces, a plurality of electric contacts being provided with a first electric contact being on a top surface of the piezoelectric blades and a second electric contact being connected to the bottom surface of the piezoelectric blades, a protection plate being only provided for each of the electric contact such at the sides of the piezoelectric blades are free of contact with the protection plate.

11. The piezoelectric blade anchoring structure of claim 1, wherein a plurality of protection plates are provided.

12. The piezoelectric blade anchoring structure of claim 1, wherein the protection plate is planar.

* * * * *